(12) United States Patent
Beintner et al.

(10) Patent No.: US 6,960,514 B2
(45) Date of Patent: Nov. 1, 2005

(54) PITCHER-SHAPED ACTIVE AREA FOR FIELD EFFECT TRANSISTOR AND METHOD OF FORMING SAME

(75) Inventors: Jochen Beintner, Wappingers Falls, NY (US); Rama Divakaruni, Ossining, NY (US); Johnathan Faltermeier, Lagrange, NY (US); Philip L. Flaitz, Newburgh, NY (US); Oleg Gluschenkov, Wappingers Falls, NY (US); Carol J. Heenan, Lagrangeville, NY (US); Rajarao Jammy, Wappingers Falls, NY (US); Byeong Kim, Lagrangeville, NY (US); Mihel Seitz, Wappingers Falls, NY (US); Akira Sudo, Yokohama (JP); Yoichi Takegawa, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 10/803,395

(22) Filed: Mar. 18, 2004

(65) Prior Publication Data

US 2004/0173858 A1    Sep. 9, 2004

Related U.S. Application Data

(62) Division of application No. 09/999,803, filed on Oct. 26, 2001, now Pat. No. 6,746,933.

(51) Int. Cl.[7] .......................................... H01L 21/762
(52) U.S. Cl. ...................................... 438/424; 438/701
(58) Field of Search ................................ 438/424, 701, 438/FOR 227

(56) References Cited

U.S. PATENT DOCUMENTS

| | | | |
|---|---|---|---|
| 4,565,584 A | | 1/1986 | Tamura et al. |
| 4,881,105 A | | 11/1989 | Davari et al. |
| 4,952,446 A | | 8/1990 | Lee et al. |
| 5,915,192 A | * | 6/1999 | Liaw et al. ................. 438/435 |
| 5,932,893 A | | 8/1999 | Miyanaga et al. |
| 5,989,969 A | | 11/1999 | Watanabe et al. |
| 6,010,797 A | | 1/2000 | Tomita et al. |
| 6,100,132 A | | 8/2000 | Sato et al. |
| 6,143,635 A | | 11/2000 | Boyd et al. |
| 6,159,823 A | | 12/2000 | Song et al. |
| 6,165,841 A | | 12/2000 | Kim et al. |
| 6,184,108 B1 | | 2/2001 | Omid-Zohoor et al. |
| 6,194,755 B1 | | 2/2001 | Gambino et al. |
| 6,232,202 B1 | * | 5/2001 | Hong ......................... 438/424 |

* cited by examiner

*Primary Examiner*—George Fourson
(74) *Attorney, Agent, or Firm*—Schmeiser, Olsen & Watts; Steven Capella

(57) ABSTRACT

An improved pitcher-shaped active area for a field effect transistor that, for a given gate length, achieves an increase in transistor on-current, a decrease in transistor serial resistance, and a decrease in contact resistance. The pitcher-shaped active area structure includes at least two shallow trench insulator (STI) structures formed into a substrate that defines an active area structure, which includes a widened top portion with a larger width than a bottom portion. An improved fabrication method for forming the improved pitcher-shaped active area is also described that implements a step to form STI structure divots followed by a step to migrate substrate material into at least portions of the divots, thereby forming a widened top portion of the active area structure. The fabrication method of present invention forms the pitcher-shaped active area without the use of lithography, and therefore, is not limited by the smallest ground rules of lithography tooling.

12 Claims, 5 Drawing Sheets

PITCHER-SHAPED ACTIVE AREA FOR FIELD EFFECT TRANSISTOR AND METHOD OF FORMING SAME

This application is a divisional of Ser. No. 09/999,803; filed on Oct. 26, 2001 now U.S. Pat. No. 6,746,933.

BACKGROUND OF THE INVENTION

1. Technical Field

The invention relates to a semiconductor device for use in a semiconductor integrated circuit, and more particularly, to a pitcher-shaped active area for a field effect transistor having a widened top portion.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced without loss of device performance. Particularly, because the integration of semiconductor devices increases, there is a corresponding size reduction in field effect transistors (FETs).

FETs are the basic electrical devices of today's integrated circuits. Such transistors may be formed in conventional substrates (such as a silicon substrate), or in silicon-on-insulator (SOI) substrates for example. For example, a conventional metal oxide semiconductor field effect transistor (MOS FET) formed in a silicon substrate may include a gate oxide layer formed on the substrate, a gate formed on the gate oxide layer, spacers formed beside the gate on the gate oxide layer, and a doped source region and a doped drain region arranged on respective sides of a gate conductor in the substrate. The gate is separated from a channel (which is situated between the source and drain regions) by the gate oxide layer. Shallow trench insulator (STI), local oxidation of silicon (LOCOS), or poly-buffered LOCOS isolations are usually employed to provide for isolation of adjacent transistors.

Conventionally, in the process of fabricating a conventional FET, lithography is used to form an opening for an active area for the FET, then etching is carried out to form the actual active area for the FET in the silicon substrate. However, there are some problems associated with the conventional FET active area and the conventional method steps for forming such a FET active area. First, the top width of the active area structure of the FET is generally defined by lithography, and therefore, is limited by the smallest ground rules for exposure with a lithography tool. Second, because the top corners of the active area are angular and not rounded, the top angular corners of the active area create a higher electric field between the gate conductor and the active area, which translates into a lower threshold voltage at the angular corners than at the back of the FET.

Additionally, when the FET is operated, an electric field is generated by applying a voltage to the gate. The electrical field is used to control a channel, which is between the source region and the drain region. For example, if channel is turned on, the electrons flow from the source region to the drain region. In contrast, if the channel is turned off, the electrons cannot flow between the source region and the drain region. Therefore, the on or off state of the channel controls the connection or disconnection of the circuit. In current device designs for logic and memory devices, a high transistor on-current is essential for fast charge transfer and therefore, increased switching speed of the logic or memory device. One conventional method of increasing transistor on-current is by reducing the effective channel length by reduction of the lithographic gate length. However, his conventional method necessitates an increase in channel doping combined with source-drain engineering for highly doped shallow extensions in device design in an attempt to try and avoid transistor short-channel effects and higher serial resistance.

Thus, there is a need for an improved active area structure for a FET having an increased transistor on-current, a decreased transistor serial resistance, and a decreased contact resistance.

DISCLOSURE OF THE INVENTION

The present invention provides an improved pitcher-shaped active area for a field effect transistor (FET) that, for a given gate length, achieves an increase in transistor on-current, a decrease in transistor serial resistance, and a decrease in contact resistance without any complex device engineering. In contrast to the conventional practice of continually increasing device density in integrated circuits by narrowing especially the width of active area sites and reducing the gate length, the present invention widens the top portions of active area sites keeping the same gate length or slightly increasing it, thereby simplifying source-drain engineering. Thus, the present invention maintains the benefit of a wider active area, which maintains or increases transistor on-current.

In association with one embodiment of present invention, a pitcher-shaped active area structure for a FET includes a semiconductor substrate. Formed into the substrate are at least two shallow trench insulator (STI) structures that isolate the FET and define an active area structure. The active area structure includes a widened top portion; and a bottom portion, wherein the widened top portion has a larger width than the bottom portion.

The present invention also provides an improved fabrication method for forming the pitcher-shaped active area for a FET. In association with one embodiment of present invention, a method is disclosed wherein a pitcher-shaped active area is formed by implementing a step to form shallow trench insulator (STI) divots followed by a step to migrate substrate material into the STI divots, thereby forming a widened top portion of the active area structure. The fabrication methods of the present invention form the pitcher-shaped active area without the use of lithography, and therefore, are not limited by the smallest ground rules for exposure with a lithography tool. Furthermore, the migration step may cause rounded corners in the widened top portion of the active area structure, thereby creating a lower electric field between the gate conductor and the active area. The lower electric field translates into a threshold voltage at the rounded corners that approaches or is equivalent to the threshold voltage at the back of the FET.

The foregoing and other features and advantages of the present invention will be apparent from the following more particular description of the invention, as illustrated in the accompanying drawings.

DETAILED DESCRIPTION OF THE INVENTION

Figure 1:
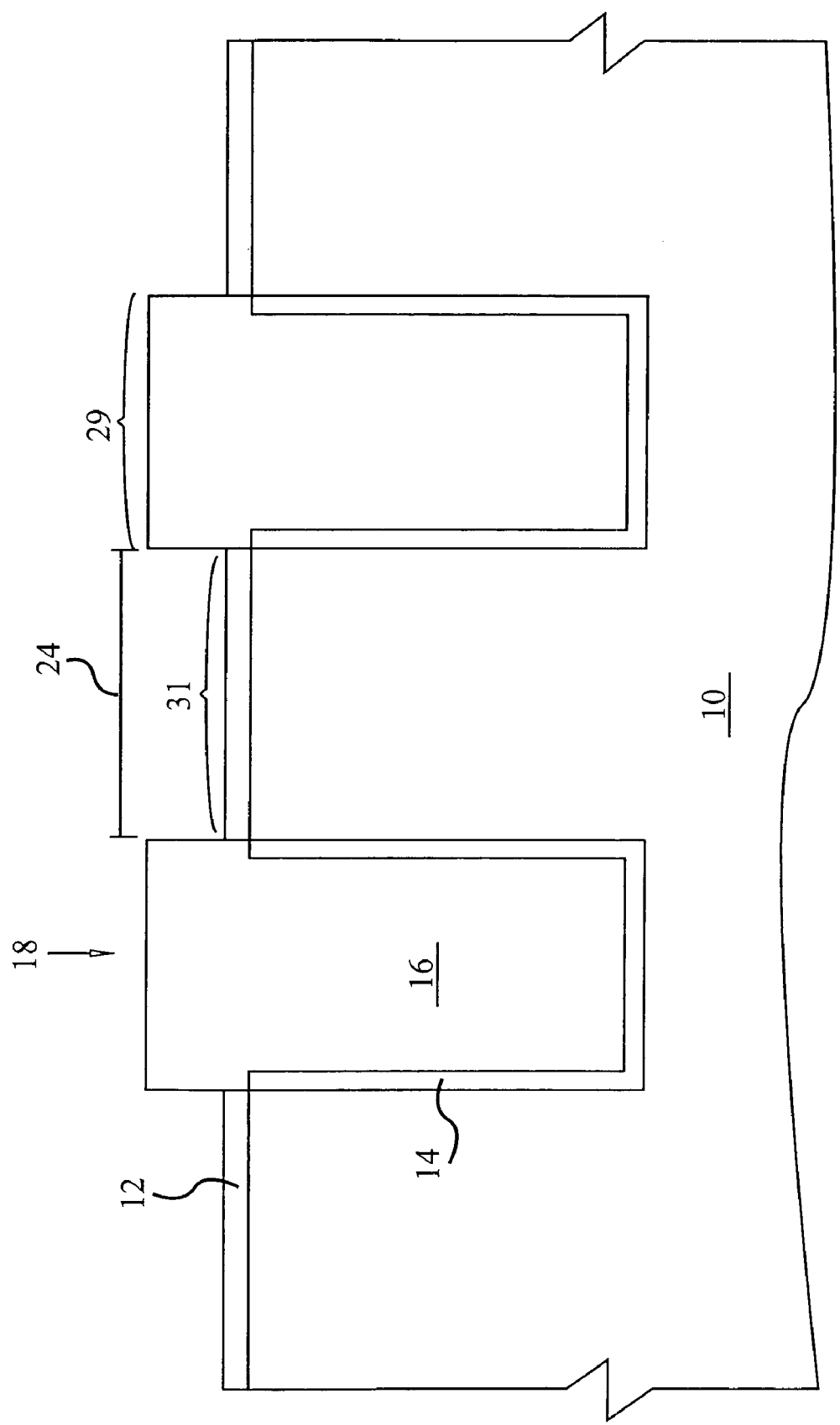
FIGS. 1–3 are cross-sectional views depicting various stages during a fabrication process of a pitcher-shaped active area according to an embodiment of the present invention.
Figure 2:
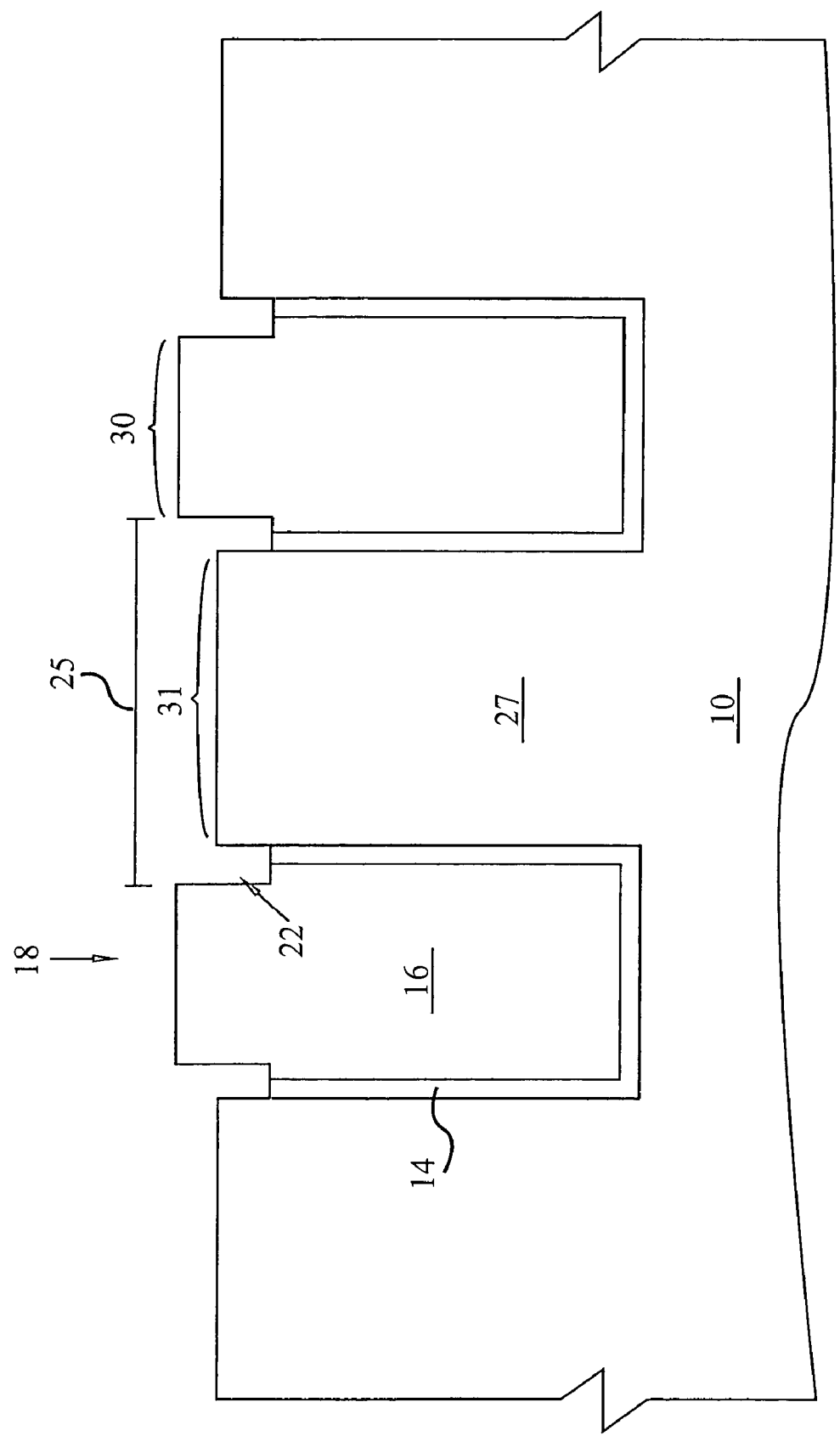
Figure 3:
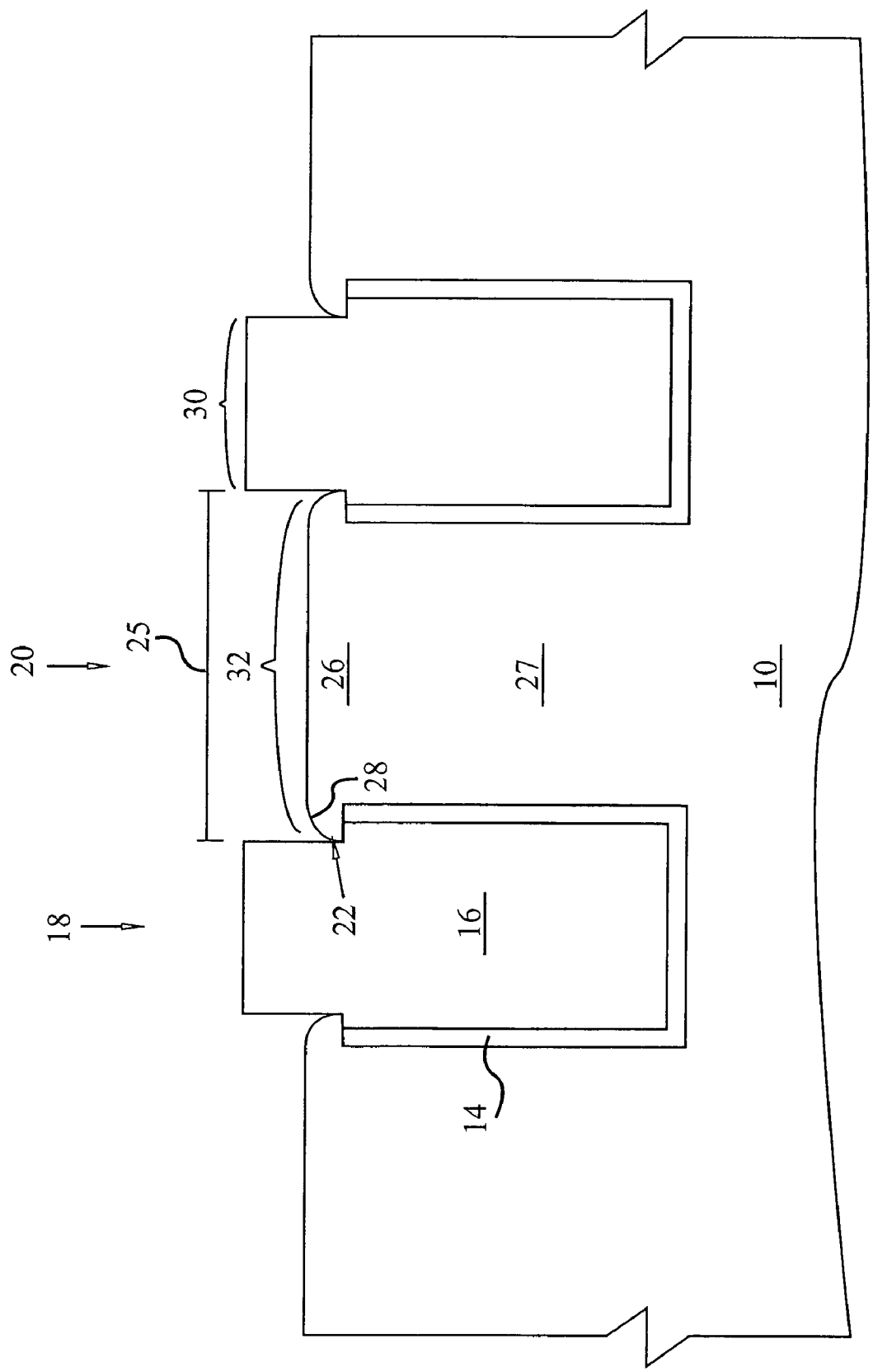
Figure 4:
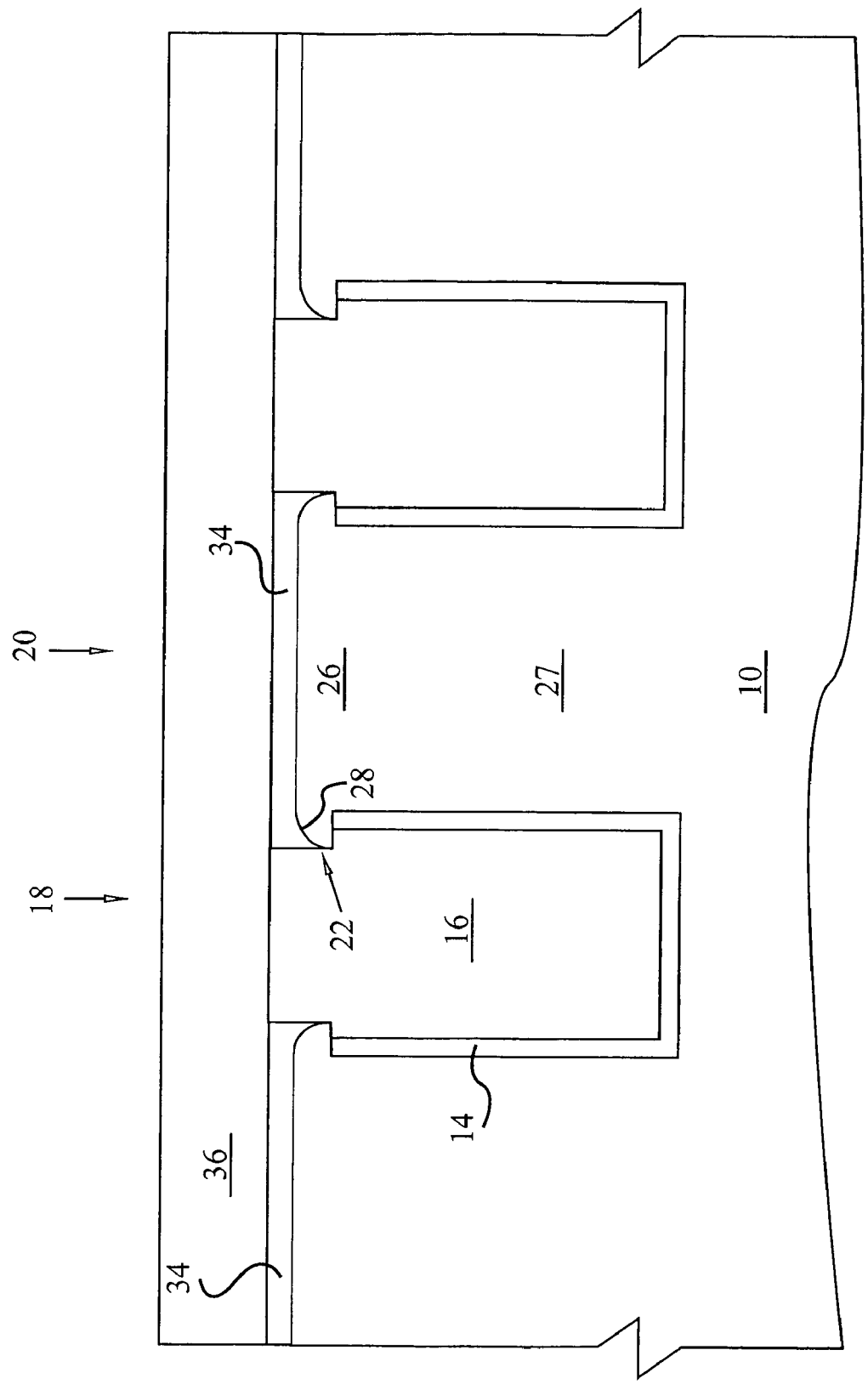
FIG. 4 is a cross-sectional view taken along the line 4—4 of FIG. 5 and depicts a pitcher-shaped active area configured according to an embodiment of the present invention after gate conductor deposition.

Although the present invention may be readily adapted to a variety of methods of fabricating a FET, with reference to FIGS. 1–4, the following is an example of a method of fabrication. FIGS. 1–4 are cross-sectional views depicting various stages during the fabrication process of pitcher-shaped active area 20 of a FET, as depicted in FIGS. 3 and 4. Generally, the improved fabrication method of present invention may form pitcher-shaped active area 20 by implementing a step to form divots 22 in top portions of the side walls of STI structures 18. Following the formation of divots 22, a step may be implemented to migrate substrate material into STI divots 22, thereby forming widened top portion 26 of pitcher-shaped active area structure 20. It will be understood by one of ordinary skill in the art that the invention is not limited to the specific structures illustrated in the drawings or to the specific steps detailed herein. It will also be understood that the invention is not limited to use of any specific dopant types provided that the dopant types selected for the various components are consistent with the intended electrical operation of the device.

FIG. 1 is a cross sectional view depicting STI structures 18 according to the present invention. The method of the present invention may begin with any of the available traditional STI formation techniques. Thus, the method of the present invention described herein may begin with forming a semiconductor substrate 10. While semiconductor substrate 10 is depicted as having a minimum of complexity, other substrates of varying complexity may be advantageously employed. For example, substrate 10 may be an N-type or P-type substrate or may be an N-type or P-type substrate encompassing N and/or P-type well regions and/or an epitaxial layer. Substrate 10 may be composed of any appropriate semiconducting material, including, but not limited to: Si, Ge, GaP, InAs, InP, SiGe, GaAs, or other III/V compounds. For the exemplary purposes of this disclosure, semiconductor substrate 10 of the following example may be a silicon substrate 10 with a lightly doped epitaxial region therein.

Pad oxide layer 12 may be formed on silicon substrate 10 using thermal oxidation, such as rapid-thermal processing (RTP)or furnace processing for example, or other techniques known in the art. Pad oxide layer 12 may be silicon oxide, and typically, pad oxide layer is conventionally between 3 nm and 10 nm thick. Overlaid on pad oxide layer 12 may be a pad dielectric layer, which typically includes a silicon nitride layer and might have a conventional thickness of about 90 nm. A chemical vapor deposition (CVD) process, a high temperature low pressure CVD (LPCVD) process or other deposition techniques known in the art, including plasma enhanced CVD (PECVD), or sputtering, for example, all may be used to deposit the pad dielectric layer.

STIs or trenches may be formed into substrate 10 through the pad dielectric layer and pad oxide layer 12. Trenches and STI structures as described below, are typically used in MOS and CMOS technology to provide for isolation between adjacent transistors, as well as define active areas. In forming trenches, conventional photolithography and etch techniques may be used to expose and etch part of the surface of silicon substrate 10 under the pad dielectric layer and pad oxide layer 12. Optionally, in some instances, hardmask deposition is desirable prior to lithography. Tetra ethyl ortho silicate (TEOS) oxide, for example, serves as an excellent hard mask for subsequent reactive ion etch (RIE) etching because the resist pattern may be exactly transferred into the TEOS oxide. Thus, an STI pattern may be etched into both the pad nitride layer and pad oxide layer 12. Then, using a plasma etch or other techniques known in the art, thereby forming trenches into silicon substrate 10 using either photoresist as a mask, or alternatively, using the hard mask (e.g., TEOS oxide). The depth of the trenches may be determined based on the required degree of isolation. Typically, the trenches may be formed to a depth of about 300–10,000 Å.

Still referring to FIG. 1, initial STI structures 18 may be fabricated. Typically, before filling the trenches with a suited isolator, STI oxide liner 14 may be formed on the bottom and side trench walls using thermal oxidation or other techniques known in the art. This is advantageous if the trenches are to be filled by TEOS oxide, which is a deposited oxide. That is, deposited TEOS oxide may include surface states at the interface to silicon substrate 10, and such surface states are not desired. Moreover, STI oxide liner 14 may serve to aid in recovering from damage that may be caused to the substrate during the etching process for forming the trenches. After the formation of STI oxide liner 14, the trenches may be filled with a suited isolator, such as STI oxide fill 16. A high-density plasma chemical vapor deposition (HDP-CVD) technique may be used to generate HDP oxide for filling the trenches. Nevertheless, other techniques may be used for filling the trenches, such as CVD or PECVD for example. Alternatively, TEOS oxide may be used to fill the trenches as mentioned previously. Thus, any suitable fill material may be used, as long a sufficient isolation of adjacent transistors and definition of active areas are guaranteed. For the exemplary purposes of this disclosure, STI oxide fill 16 of this example may be HDP oxide.

After trenches are filled with a suitable isolator, such as STI oxide fill 16, a planarization process such as resist etch back (REB), RIE, or, typically, chemical mechanical polishing (CMP) may be used to remove excess STI oxide fill 16 to acquire a more planar surface along the pad nitride layer. After planarization of STI oxide fill 16 down to the pad nitride layer, the pad nitride layer may be deglazed by using any controlled wet etch, such as a diluted hydrogen fluoride acid (DHF) or a buffered hydrogen fluoride acid (BHF) treatment to etch away the pad nitride layer. A BHF solution, typically comprises HF buffered with, for example, ammonium fluoride ($NH_4F$). The pad nitride layer is then stripped away after the deglaze using a hot phosphoric acid etch or a plasma etch for example, both selective to oxide.

As a result of stripping away the pad nitride layer, STI structures 18 may remain. That is, as depicted in FIG. 1, STI structures 18, and more particularly the HDP oxide 16 levels of STI structures 18, may protrude above the upper silicon level of substrate 10. Notwithstanding, STI structures 18 may be equal to or substantially planar with the upper silicon level of substrate 10 as well according to the present invention. In either embodiment, STI structures 18 have initial large widths 29. In the embodiment where STI structures 18 protrude above substrate 10, as depicted in FIG. 1, small opening 24 is formed by the removal of the pad nitride layer so that it is defined between STI structures 18 above the active area. Because STI structures 18 may define both small opening 24 and the active area, small opening 24 and the active area may have the same small width 31.

Referring now to FIG. 2, after stripping away the pad nitride layer, divots 22 may be formed in STI structures 18 according to a fabrication method of the present invention. The formation of divots 22 may simultaneously: reduce large widths 29 of the top portions of STI structures 18 to small widths 30; and form large opening 25 defined by STI structures 18. Therefore, STI structures 18 may be narrower at their top portions than at their bottom portions, the narrower top portions defining large opening 25. Thus, large opening 25 may be formed without the use of lithography, and accordingly, the width of the active area may be increased by decreasing the widths of the top portions of STI structures 18 from widths 29 to widths 30.

Any technique that may form divots 22 according to the present invention may be implemented. For example, divots 22 may be formed by stripping away pad oxide layer 12 using a wet etch which creates divots 22 in top portions of the sidewalls of STI structures 18. The wet pad oxide etch may be a BHF treatment to etch away pad oxide layer 12 and portions of oxide fill 16 and STI liner oxide 14 that may comprise top portions of the sidewalls of STI structures 18. Immersion in BHF solutions, spraying with BHF solutions, or treatment by BHF vapors, for example, are all suitable BHF treatments. Alternatively, other selective oxide etches could be used as well, such as an isotropic plasma etch selective to silicon. For the exemplary purposes of this disclosure, the wet pad oxide etch may be the BHF etch. Thus, the BHF etch, in removing pad oxide layer 12 and portions of the sidewalls of STI structures 18 comprising portions of oxide fill 16 and STI liner oxide 14, may provide a hydrogen passivated oxide free silicon substrate 10 surface.

Wet pad oxide etch reaction times may vary, as the depth of divots 22 depends on the concentration of the etchant. That is, the higher the concentration of the etchant, the less the reaction time and the lower the concentration of the etchant, the greater the reaction time. Thus, for example, in one particular embodiment of the invention, an approximately 40/1 etch chemistry is used for a reaction time of approximately 1–2 minutes. Generally, for each minute of the reaction, approximately 200 Å of material may be removed from portions of the side walls of STI structures 18. While there is no specific requirement for the depth of divots 22 in STI structures 18, the depth of divots 22 may be up to approximately 500 Å. In a particular embodiment of the invention, the depth of divots 22 are formed to approximately 300 Å. Generally, the deeper the depth of divots 22, the more top corners of the active area may be rounded, as described in greater detail below. However, if the depth of divots 22 is to great, the advantages of a having a widened top portion of the active area (as previously described and described in greater detail below) might be diminished.

Turning now to FIG. 3, once STI divots 22 are formed according to the present invention, a migration step may be implemented according to a fabrication method of the present invention to migrate substrate 10 material into STI divots 22, thereby forming widened top portion 26 of pitcher-shaped active area structure 20. For the exemplary purposes of this disclosure, as semiconductor substrate 10 may be a silicon substrate 10, the migration step may be implemented to migrate silicon of substrate 10 into STI divots 22, thereby forming widened top portion 26 of pitcher-shaped active area structure 20. Any technique that may migrate silicon into divots 22 according to the present invention may be implemented. A hydrogen ($H_2$) anneal step may be used migrate silicon into divots 22. Additionally, through the $H_2$ anneal step, top portion 26 may also comprise rounded top corners 28. More particularly, the surface migration of silicon atoms in semiconductor substrate 10 caused by the $H_2$ annealing process may also round top corners 28 of top portion 26, thereby creating a lower electric field between the gate conductor and the active area. The lower electric field translates into a threshold voltage at rounded corners 28 that approaches or is equivalent to the threshold voltage at the back of the FET.

Still referring to FIG. 3, widened top portion 26 with large width 32 and bottom portion 27 with small width 31 comprise pitcher-shaped active area 20. A widening of top portion 26 is depicted in FIGS. 2 and 3 respectively. During a migration step of the present invention, the width of top portion 26 increases from small width 31 (FIG. 2) to large width 32 (FIG. 3). Therefore, in a particular embodiment of the invention, the $H_2$ anneal step may migrate silicon of semiconductor substrate 10 outward into at least portions of STI divots 22 particularly (into at least a portion of large opening 25 generally), thereby forming widened top portion 26 with large width 32, the same width 32 of large opening 25. Thus, the width of top portion 26, which forms pitcher-shaped active area 20, may be increased without the use of lithography.

The migrated silicon filling at least a portion of STI divots 22 as a result of the $H_2$ anneal step described previously results in a single crystalline structure. Single crystalline structure has a better substrate quality than a polycrystalline structure. That is, a single crystalline structure has less areas of defects, which in turn increases performance of the transistor. In a particular embodiment of the invention, the $H_2$ anneal step is carried out at approximately 1050° C. However, the $H_2$ anneal step may be carried out at a temperature of 700° C. or higher, as lower temperatures may not initiate silicon migration at all or may not initiate silicon migration effectively. The annealing process may be carried out under any pressure of $10^{-3}$ Torr or more. In one particular embodiment, the annealing process may be carried out under a pressure of 10 Torr to 80 Torr. In another particular embodiment, the annealing process may be carried out under a pressure of $10^3$ Torr or more.

Referring to FIG. 4, the process may be continued using any standard MOS transistor process flow technique for example. A sacrificial oxide layer, such as a clean oxide layer, may be formed at the main surface of semiconductor substrate 10 by any technique known in the art. The sacrificial oxide layer is a screen oxide that is used prior to ion implantation to avoid channeling of the implanted elements. An ion implantation technique may be executed to dope the epitaxial layer in substrate 10 or to dope any other silicon substrate, thereby forming p-well structures and/or n-well structures at the main surface of semiconductor substrate 10. In CMOS technology, p-well structures and n-well structures are formed to allow the integration of NMOS and PMOS transistors in a common substrate. Well suited for n-type doping are: P, As and Sb, for example. Well suited for p-type doping are: B, In and $BF_2$, for example. The sacrificial oxide layer may then be stripped away by any technique known in the art.

Still referring to FIG. 4, by thermally oxidizing the main surface of semiconductor substrate 10, gate oxide layer 34, which will form the gate insulating layer, may be formed on the main surface of semiconductor substrate 10, overlying active area 20. Gate oxide layer 34 may typically be a silicon oxide layer, although other appropriate materials may be used. For example, gate oxide layer 34 may be formed of a thermal oxide, a nitrided oxide, or possibly as a composite layer of CVD oxide and either thermal oxide, nitrided oxide, or pure nitride. In addition, gate oxide layer 34 may be formed as a composite layer of silicon oxide and silicon nitride, or formed of one of the high dielectric materials or combinations thereof.

Gate conductor layer 36 may be formed overlying gate oxide layer 34 as also depicted in FIG. 4. Gate conductor layer 36 may be any suitable conducting material, typically a polycrystalline silicon material, although amorphous silicon, a combination of amorphous silicon and polysilicon or any other appropriate material may be used to form gate conductor layer 36. In addition, in some embodiments of the present invention, it might be advantageous to employ a metal gate conductor layer 36, such as tungsten (W), molybdenum (Mo) or tantalum (Ta), or alternatively, a silicided gate conductor comprising polysilicon added with nickel (Ni) or cobalt (Co). Where gate conductor layer 36 encompass a silicon material, such layers may be deposited as a doped layer (in-situ doping) and/or doped concurrently with the doping of other regions, for example while doping the source and drain regions. Where gate conductor layer 36 is a metal layer, such layers may be deposited using physical vapor or chemical vapor deposition methods or any other technique known in the art.

Thus, in FIG. 4, an embodiment of the present invention is depicted having a minimum of complexity. This depicted embodiment of the present invention is at a stage of a FET process flow technique modified by an improved fabrication method of the present invention for forming improved pitcher-shaped active area 20. Particularly in this embodiment, semiconductor substrate 10 is depicted. Shallow trench insulator (STI) structures 18 are formed into substrate 10 and comprise STI oxide liner 14 and STI oxide fill 16. STI structures 18 define active area structure 20. Active area structure 20 is pitcher-shaped and comprises: widened top portion 26 having rounded top corners 28 and larger width 32 (FIG. 3); and bottom portion 27 with smaller width 31 (FIG. 2). Widened top portion 26 is formed into divots 22 in portions of the STI liner oxide and the STI oxide fill that form top portions of the side walls of STI structures 18. Gate oxide layer 34 is formed on the main surface of semiconductor substrate 10, overlying pitcher-shaped active area 20. Gate conductor layer 36 is formed overlying gate oxide layer 34.

An increase in transistor on-current and a decrease in transistor serial resistance is achieved by widened top portion 26 of pitcher-shaped active area structure 20 exemplified in FIG. 4. Without rounded top corners 28 of widened top portion 26, there would be a higher electric field between gate conductor layer 36 and active area 20 corner, which would translate into a lower threshold voltage at the angled corner than at the back of the device. Additionally, with rounded top corners 28 of widened top portion 26, a better gate oxide reliability is obtained than without rounded top corners 28. Moreover, the back biased sensitivity is improved similar to that achieved by a silicon on insulator (SOI) structure, as widened top portion 26 extends over underlying STI oxide fill 16.

Figure 5:
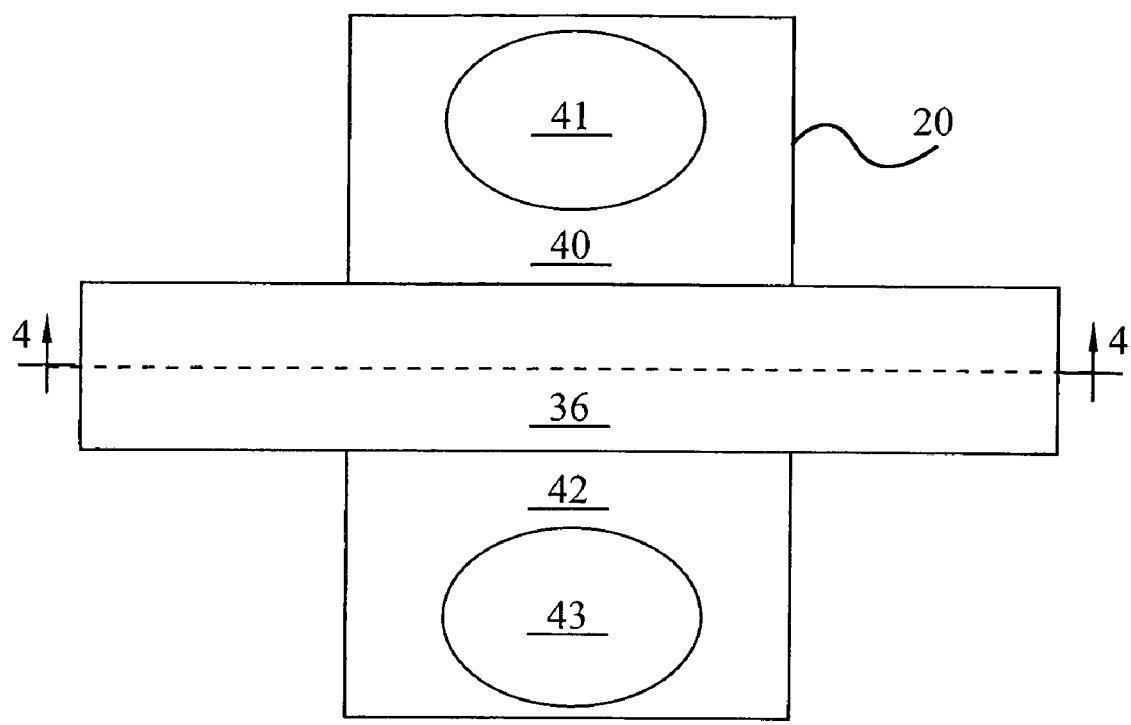
FIG. 5 is a top plan view of a field effect transistor configured according to an embodiment of the present invention overlying a pitcher-shaped active area (not shown).

Turning to FIG. 5 generally, the present invention provides a FET with an improved pitcher-shaped active area 20 that, for a given gate length, achieves an increase in transistor on-current, a decrease in transistor serial resistance, and a decrease in contact resistance without an complex device engineering. The present invention relates to any type of FET, such as, for example, metal oxide semiconductor field effect transistors (MOS FETs), complimentary metal oxide semiconductor field effect transistors (CMOS FETs), n-channel metal oxide semiconductor field effect transistors (NMOS FETs), p-channel metal oxide semiconductor field effect transistors (PMOS FETs), and the like, having pitcher-shaped active area 20.

Still referring to FIG. 5, once formed, layers 34 and 36 may be patterned and structured using well known photolithography and etching techniques to form a gate structure overlying a portion of pitcher-shaped active area 20. Source region 40 and drain region 42 (S/D regions 40 and 42) may be formed adjacent to opposite sides of the gate structure in pitcher-shaped active area 20 and may define a channel region underlying the gate structure. Formation of S/D regions 40 and 42 may be accomplished using any of the variety of methods that have been developed to form S/D regions 40 and 42 and that are tailored for specific performance requirements. There are many such methods for forming S/D regions 40 and 42 having various levels of complexity. Thus, in some embodiments of the present invention, using ion implantation for example, lightly doped S/D regions 40 and 42 or other S/D regions 40 and 42 may be formed. Notwithstanding the method used to form S/D regions 40 and 42, where semiconductor substrate 10 is a P-type substrate, or active area 20 encompasses a P-type well structure, S/D regions 40 and 42 are doped N-type. Alternatively, where substrate 10 is N-type or active area 20 encompasses an N-type well region, S/D regions 40 and 42 are doped P-type.

In some embodiments of the present invention, though not shown in FIG. 5, sidewall spacers may be employed during formation of S/D regions 40 and 42. In some embodiments, a dielectric material may be deposited as a blanket dielectric layer and may be anisotropically etched to form the spacers. The anisotropic etch process selected may be selective to both the material of STI structures 18 and substrate 10. The dielectric material selected may be a CVD or PECVD silicon oxide material. In some embodiments, materials other than silicon oxide and/or a combination of materials is employed. Thus, spacers 60 may be formed using silicon oxide, silicon nitride, or a combination of oxide and nitride and typically overlie portions of each S/D region 40 and 42.

To complete the FET, an inter metal dielectric (oxided, fluorinated oxide, and the like) is deposited and planarized typically using a CMP process. Contact holes are structured and etched using an anisotropic RIE process or the like. The contact holes are filled using any conducting material, such as doped polysilicon, silicide (e.g. WSi), metals (e.g. Au, Al, Mo, Ta, Ti, Cu, or ITO (indium-tin oxide)), or the like, being deposited by CVD or other techniques, thereby forming source contact 41 and drain contact 43. Then the first metal layer is deposited and structured using a RIE process or the like. Alternatively, the structuring of the first metal layer could be done following a damacene process flow.

FETs with pitcher-shaped active areas 20 according to the present invention may be used in many different kinds of circuits, such as high performance logic, low power logic or high density memory devices, including high density multi-gigabit DRAMs. The inventive FETs with pitcher-shaped active areas 20 may readily be combined with other elements, such as for example capacitors, resistors, diodes, memory cells and so forth. Because of their small size and relatively simple fabrication, the present FETs with pitcher-shaped active areas 20 are also suited for use in connection with organic displays and liquid crystal displays.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims. Accordingly, unless otherwise specified, any components of the present invention indicated in the drawings or herein are given as an example of possible components and not as a limitation. Similarly, unless otherwise specified, any steps or sequence of steps of the method of the present invention indicated herein are given as examples of possible steps or sequence of steps and not as limitations.

What is claimed is:

1. A pitcher-shaped active area structure for a field effect transistor (FET) comprising:
   a semiconductor substrate; and
   at least two shallow trench insulator (STI) structures formed into the substrate that isolate the FET and define an active area structure, the active area structure comprising a widened top portion and a bottom portion, wherein the widened top portion has a larger width than the bottom portion.

2. The structure of claim 1 further comprising a pad oxide layer formed on the substrate, and wherein the at least two STI structures are formed into the substrate through the pad oxide layer, the at least two STI structures comprising an STI oxide liner and an STI oxide fill formed on the STI oxide liner.

3. The structure of claim 1, wherein the at least two STI structures comprise divots in top portions of side walls of the at least two STI structures into which the widened top portion of the active area structure extends.

4. The structure of claim 3, wherein the semiconductor substrate comprises silicon, and wherein the widened top portion formed into divots comprises single crystalline silicon.

5. The structure of claim 3, wherein the divots comprise a depth of approximately 500 Å or less.

6. The structure of claim 1, wherein the widened top portion of the active area structure further comprises rounded top corners.

7. The structure of claim 6, wherein the widened top portion of the active area structure includes a pad oxide layer that is in direct mechanical contact with the at least two STI structures.

8. The structure of claim 7, further comprising a gate conductor layer on the pad oxide layer and on the at least two STI structures, wherein the gate conductor layer is in direct mechanical contact with the pad oxide layer and the at least two STI structures.

9. The structure of claim 3, wherein the STI structures comprise insulation, wherein the divots define recesses below a top surface of the substrate and below a top surface of the insulation, and wherein the recesses have boundaries formed by the top portions of the side walls and by exterior surfaces of the insulation.

10. The structure of claim 9, wherein the widened top portion of the active area structure further comprises rounded top corners.

11. The structure of claim 10, wherein the widened top portion of the active area structure includes a pad oxide layer that is in direct mechanical contact with the at least two STI structures.

12. The structure of claim 11, further comprising a gate conductor layer on the pad oxide layer and on the at least two STI structures, wherein the gate conductor layer is in direct mechanical contact with the pad oxide layer and the at least two STI structures.

* * * * *